United States Patent
Hong et al.

(10) Patent No.: US 7,919,810 B2
(45) Date of Patent: Apr. 5, 2011

(54) DEVICE WITH POLYMER LAYERS AND TWO-STEP SELF-ALIGNED SOURCE ETCH WITH LARGE PROCESS WINDOW

(75) Inventors: Zhongshan Hong, Shanghai (CN); Xue Li, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/539,575

(22) Filed: Aug. 11, 2009

(65) Prior Publication Data

US 2010/0123179 A1 May 20, 2010

Related U.S. Application Data

(62) Division of application No. 11/611,363, filed on Dec. 15, 2006, now Pat. No. 7,645,667.

(30) Foreign Application Priority Data

Nov. 30, 2006 (CN) .......................... 2006 1 0119024

(51) Int. Cl.
  *H01L 21/331* (2006.01)
  *H01L 21/8222* (2006.01)
  *H01L 21/31* (2006.01)
  *H01L 21/469* (2006.01)
(52) U.S. Cl. .................. 257/316; 257/774; 257/775
(58) Field of Classification Search ............. 438/237, 438/712, 717; 257/E21.218, 316, 774, 775
  See application file for complete search history.

(56) References Cited

U.S. PATENT DOCUMENTS

| | | |
|---|---|---|
| 6,025,255 A | 2/2000 | Chen et al. |
| 6,531,359 B1 | 3/2003 | Tempel et al. |
| 6,784,056 B2 | 8/2004 | Schneider et al. |
| 7,645,667 B2 | 1/2010 | Hong et al. |
| 2006/0160308 A1* | 7/2006 | Kim .............................. 438/261 |

OTHER PUBLICATIONS

Notice of Allowance for U.S. Appl. No. 11/611,363, mailed on May 15, 2009, 7 pages.
"*Post Etch Residue (Polymer Removal)*," Surface Preparation, Cleaning Post-Etch Residue (Polymer Removal); Applications Solutions Provider; Semitool Inc.; Jun. 26, 2006; 2 pages total. http://snf-www.stanford.edu/Process/PlasmaEtch/Oxide.html.
"*Plasma Etch: Oxide Etch Overview*," Oxide Plasma Etching; Stanford Nanofabrication Facility; Jan. 21, 2009, 6 pages total. http://www.semitool.com/Post_Etch.html.
Requirement for Restriction/Election for U.S. Appl. No. 11/611,363 mailed on Mar. 26, 2009, 6 pages.

* cited by examiner

*Primary Examiner* — William M. Brewster
(74) *Attorney, Agent, or Firm* — Kilpatrick Townsend & Stockton LLP

(57) ABSTRACT

System and method for self-aligned etching. According to an embodiment, the present invention provides a method for performing self-aligned source etching process. The method includes a step for providing a substrate material. The method also includes a step for forming a layer of etchable oxide material overlying at least a portion of the substrate material. The layer of etchable oxide material can characterized by a first thickness. The layer of etchable oxide material includes a first portion, a second portion, and a third portion. The second portion is positioned between the first portion and the third portion. The method additionally includes a step for forming a plurality of structures overlying the layer of etchable oxide material. The plurality of structures includes a first structure and a second structure.

5 Claims, 14 Drawing Sheets

DEVICE WITH POLYMER LAYERS AND TWO-STEP SELF-ALIGNED SOURCE ETCH WITH LARGE PROCESS WINDOW

CROSS-REFERENCES TO RELATED APPLICATIONS

This application is a divisional of U.S. patent application Ser. No. 11/611,363, filed Dec. 15, 2006, and issued Jan. 12, 2010 as U.S. Pat. No. 7,645,667, 2010, which claims priority to Chinese Patent No. 200610119024.40 filed on Nov. 30, 2006, commonly assigned and hereby incorporated by reference for all purposes.

BACKGROUND OF THE INVENTION

The present invention is directed to integrated circuits and their processing for the manufacture of semiconductor devices. In particular, the invention provides a method and device for self-aligned etching. Merely by way of example, the invention has been applied to the manufacturing of devices with decreased critical dimensions (e.g., devices characterized by channel lengths of less than 135 nanometers or even smaller). As an example, the invention can be used for the process of forming floating control gates on semiconductor devices. But it would be recognized that the invention has a much broader range of applicability. For example, an embodiment of the present invention can be used for the manufacturing of flash devices.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. Most recently, various processes have been for the fabrication of integrated circuits. For example, self-aligned source (SAS) etching process, which has been develop to, among other things, enable lithography with higher definition, has been developed and widely used for the fabrication of integrated circuits with decreased size (e.g., 90 nanometer or 65 nanometer device). While processes such as self-aligned source etching enable smaller IC to be manufactured and lithography to be performed with higher resolution as compared to earlier techniques, these processes are often inadequate for various applications.

Therefore, an improved technique for processing semiconductor devices is desired.

BRIEF SUMMARY OF THE INVENTION

The present invention is directed to integrated circuits and their processing for the manufacture of semiconductor devices. In particular, the invention provides a method and device for self-aligned etching. Merely by way of example, the invention has been applied to the manufacturing of devices with decreased critical dimensions (e.g., devices characterized by channel lengths of less than 135 nanometers or even smaller). As an example, the invention can be used for the process of forming floating control gates on semiconductor devices. But it would be recognized that the invention has a much broader range of applicability. For example, an embodiment of the present invention can be used for the manufacturing of flash devices.

According to an embodiment, the present invention provides a method for performing self-aligned source etching process. The method includes a step for providing a substrate material. The method also includes a step for forming a layer of etchable oxide material overlying at least a portion of the substrate material. The layer of etchable oxide material can be characterized by a first thickness. The layer of etchable oxide material includes a first portion, a second portion, and a third portion. The second portion is positioned between the first portion and the third portion. The method additionally includes a step for forming a plurality of structures (e.g., gate structures, etc.) overlying the layer of etchable oxide material. The plurality of structures includes a first structure and a second structure. The first structure includes a first sidewall and is positioned above the first portion. The second structure includes a second sidewall and is positioned above the third portion. The first sidewall faces the second sidewall. Additionally, the method includes a step for forming a plurality of photoresist layers overlying the plurality of structures, which includes a first photoresist layer overlying the first structure and a second photoresist layer overlying the second structure. Also, the method includes a step for performing a first dry etching process at a first depth, which causes forming a first polymer layer overlying the first sidewall and a second polymer layer overlying the second sidewall. In addition, the first dry etching process removes at least a second thickness of the second portion. The second thickness being less than the first thickness. For example, the purpose of the first dry etch process is to form protective layers on the sidewall structures and the material etched during this process is minimal. Moreover, the method includes a step for performing a second dry etching process at a second depth. The second depth is greater than the first depth. The second dry etching process moves at least a third thickness of the second portion. Additionally, the method includes a step for removing the plurality of photoresist layers. Further, the method includes a step for removing the first and second sidewalls.

According to another embodiment, the present invention provides a method for performing self-aligned source etching process. The method includes a step for providing a substrate material. The method also includes a step for forming a layer of etchable oxide material overlying at least a portion of the substrate material. The layer of etchable oxide material can be characterized by a first thickness. The layer of etchable oxide material includes a first portion, a second portion, and a third portion. The second portion is positioned between the first portion and the third portion. Further, the method includes a step for forming a plurality of gate structures overlying the layer of etchable oxide material. The plurality of gate structures includes a first gate structure and a second gate structure. The first gate structure includes a first sidewall and is positioned above the first portion. The second gate structure includes a second sidewall and is positioned above the third portion. The first sidewall faces the second sidewall. The method further includes a step for forming a plurality of photoresist layers overlying the plurality of gate structures.

The plurality of photoresist layers includes a first photoresist layer overlying the first gate structure and a second photoresist layer overlying the second gate structure. The method includes a step for subjecting at least the plurality of gate structures to high rate polymer deposition, which causes forming a first polymer layer overlying the first sidewall and a second polymer layer overlying the second sidewall. Moreover, the method includes a step for performing a dry etching process at a first depth. The dry etching process removes at least a second thickness of the second portion. In addition the method includes a step for removing the plurality of photoresist layers. Also, the method includes a step for removing the first and second sidewalls.

According to yet another embodiment, the present invention provides a partially processed integrated circuit. For example, the partially process integrated circuit can be used in the process of manufacturing flash device. The partially processed integrated circuit includes a substrate material that is characterized by a substrate thickness and a substrate diameter. The partially processed integrated circuit also includes a layer of etchable oxide material overlying at least a portion of the substrate material. The layer of etchable oxide material includes a first portion, a second portion, and a third portion. The second portion is positioned between the first portion and the third portion, the first portion being characterized by a first thickness, the second portion being characterized by a second thickness. The third portion is characterized by a third thickness. The second thickness is slight less than the first thickness and the third thickness. The partially processed integrated circuit additionally includes a plurality of gate structures overlying the layer of etchable oxide material. The plurality of gate structures includes a first gate structure and a second gate structure. The first gate structure includes a first sidewall and is positioned above the first portion. The second gate structure includes a second sidewall and is positioned above the third portion. The first sidewall is facing the second sidewall. Moreover, the partially processed integrated circuit includes a plurality of photoresist layers overlying the plurality of gate structures. The plurality of photoresist layers includes a first photoresist layer overlying the first gate structure and a second photoresist layer overlying the second gate structure. Furthermore, the partially processed integrated circuit includes a plurality of polymer layers. The plurality of polymer layers includes a first polymer layer overlying the first sidewall and a second polymer layer overlying the second sidewall.

According to various embodiments, the present invention provides an improved technique for performing etching process and offers numerous advantages over conventional techniques. According to a specific embodiment, the present invention provides a two-step SAS etching process that utilizes protective layers on sidewalls of non-target structures. As a result, non-target structures maintain their definition after the etching process. It is also to be appreciated that the present invention provides longer process window for the etching process, and therefore better control, as compared to conventional techniques. There are other benefits as well.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. In particular, the invention provides a method and device for self-aligned etching. Merely by way of example, the invention has been applied to the manufacturing of devices with decreased critical dimensions (e.g., devices characterized by channel lengths of less than 135 nanometers or even smaller). As an example, the invention can be used for the process of forming floating control gates on semiconductor devices. But it would be recognized that the invention has a much broader range of applicability. For example, an embodiment of the present invention can be used for the manufacturing of flash devices.

As discussed above, various techniques have been developed for the manufacturing of integrated circuits with small dimensions (e.g., 90 nanometers and 65 nanometers in channel lengths). For example, self-aligned source (SAS) etching process has been widely used for the manufacturing of various types of flash device. The SAS etching process offer various advantages over conventional techniques. For example, SAS etching process is usually carried out with polycide process instead of salicide process. The implementation with polycide process enables lithography with higher resolution, as the SAS etching process are often performed without using stop layers (i.e., space saved by not having stop layers). For example, various existing structures (e.g., gate structures of a MOSFET, etc.)

Unfortunately, SAS etching process often has various disadvantages in comparison to earlier techniques (e.g., techniques that use stop layers during etching processes). For example, since existing structures on a substrate is utilized as masks during the etching process, portions of the existing structure are often undesirably etched away along with the target etchable material.

Figure 1A:
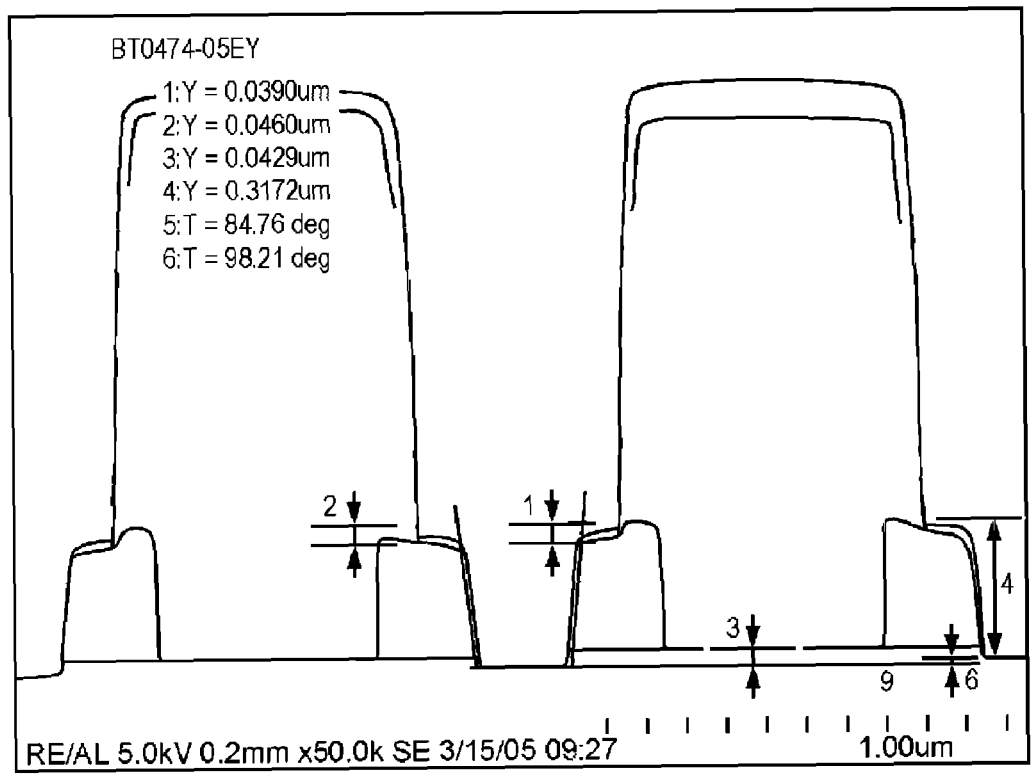
FIG. 1A illustrates a profile of a partially processed integrated circuit after a SAS etching process is performed, wherein no stop layers are used.
Figure 1B:
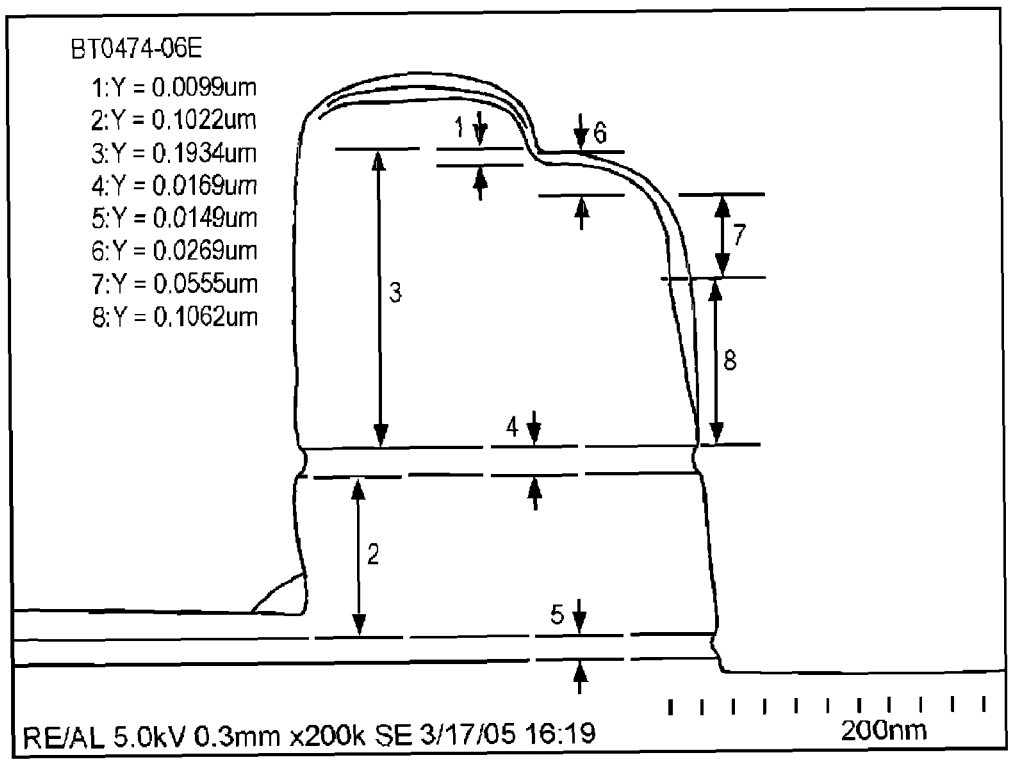
FIG. 1B illustrates a profile of a partially processed integrated circuit after re-oxidation process is performed.
Figure 1C:
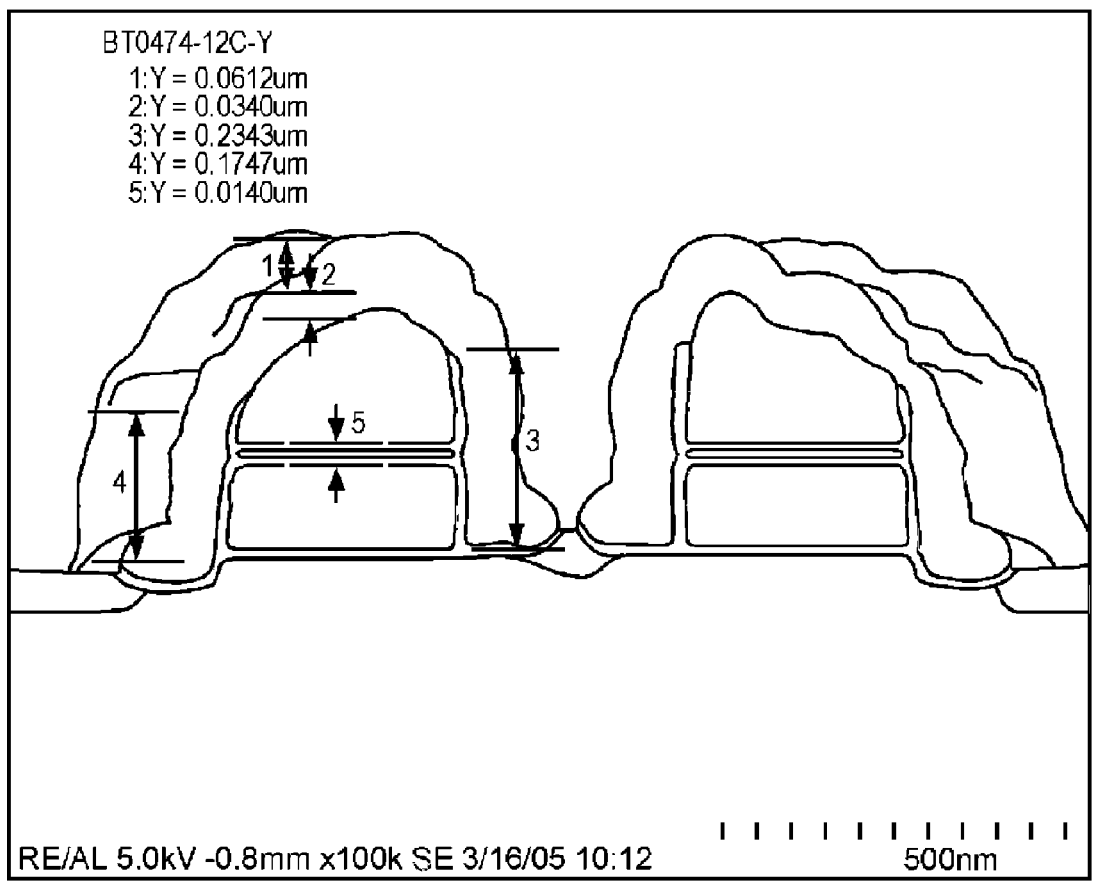
FIG. 1C illustrates a profile of a partially processed integrated circuit after salicide formation process is performed.

FIGS. 1A to 1C are profiles of partially-processed integrated circuits according to conventional techniques. These diagrams merely provide an example, which should not unduly limit the scope of the claims. One of ordinary skill in the art would recognize many variations, alternatives, and modifications. As shown from FIGS. 1A to 1C, SAS etching processes according to convention techniques often produce semiconductor structures with poor profiles and undesirable characteristics.

FIG. 1A illustrates a profile of a partially processed integrated circuit after a SAS etching process is performed, wherein no stop layers are used. As can be seen from FIG. 1A, there are undesirable loss in poly material both at the corner area and the sidewall area. In addition, there is loss in silicon material in the active area. As the etching depth increases, the problem of undesirable loss in poly and silicon material exacerbates.

FIG. 1B illustrates a profile of a partially processed integrated circuit after re-oxidation process is performed. As can be seen from FIG. 1B, corner and sidewall of the structure shown is not well defined due to poly and/or silicon loss. For example, the sidewall of the structure has a sloped profile.

FIG. 1C illustrates a profile of a partially processed integrated circuit after salicide formation process is performed. As can be seen from FIG. 1C, the loss of poly material is so great that the profile barely retains the definition of the structure. Depending upon applications, such loss in poly and the resulted structure often leads to poor performance of the finished integrated circuits.

Therefore, it is to be appreciated that the according to various embodiments, the present invention provides an improved method and system for the SAS etching process.

Figure 2:
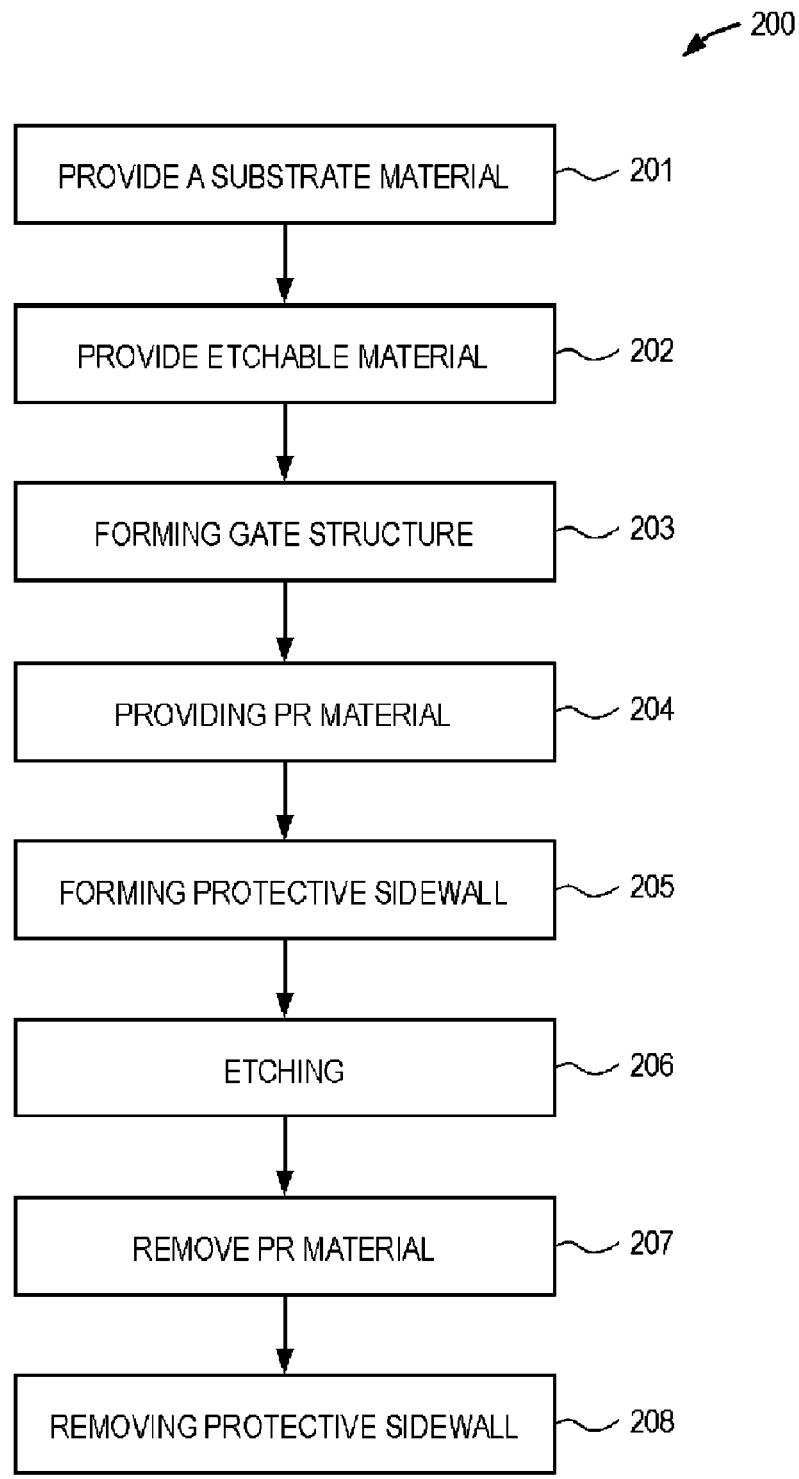
FIG. 2 is a simplified diagram illustrating an improved method for performing SAS etching process according to an embodiment of the present invention.

FIG. 2 is a simplified diagram illustrating an improved method for performing SAS etching process according to an embodiment of the present invention. This diagram is merely an example, which should not unduly limit the scope of the claims. One of ordinary skill in the art would recognize many variations, alternatives, and modifications. For example, various steps may be replaced, removed, re-arranged, overlapped, and/or partially overlapped.

At step 201, a substrate material is provided. As defined herein, the term "substrate" or "substrates" can be interpreted by a meaning consistent with one of ordinary skill in the art. That is, the term substrate can include bulk substrates, multi-layered substrates (e.g., silicon wafer with overlying dielectric and metal films), graded substrates, silicon on insulator substrates, epitaxial silicon substrates, any combination of these, including layered substrates, partially processed wafers (including portions of integrated circuits and other elements), patterned and unpatterned wafers, and the like. Of course, there can be other variations, modifications, and alternatives.

At step 202, a layer of etchable material is provided. According to a specific embodiment, the layer of etchable material is essentially oxide material which is used to provide isolation (e.g., oxide for shallow trench isolation). For example, the layer of etchable material consists of oxide for shallow trench isolation and is characterized by a thickness of between 1,000 to 6,000 angstroms. Depending upon application, the etchable material can be materials other than oxide material.

Figure 3:
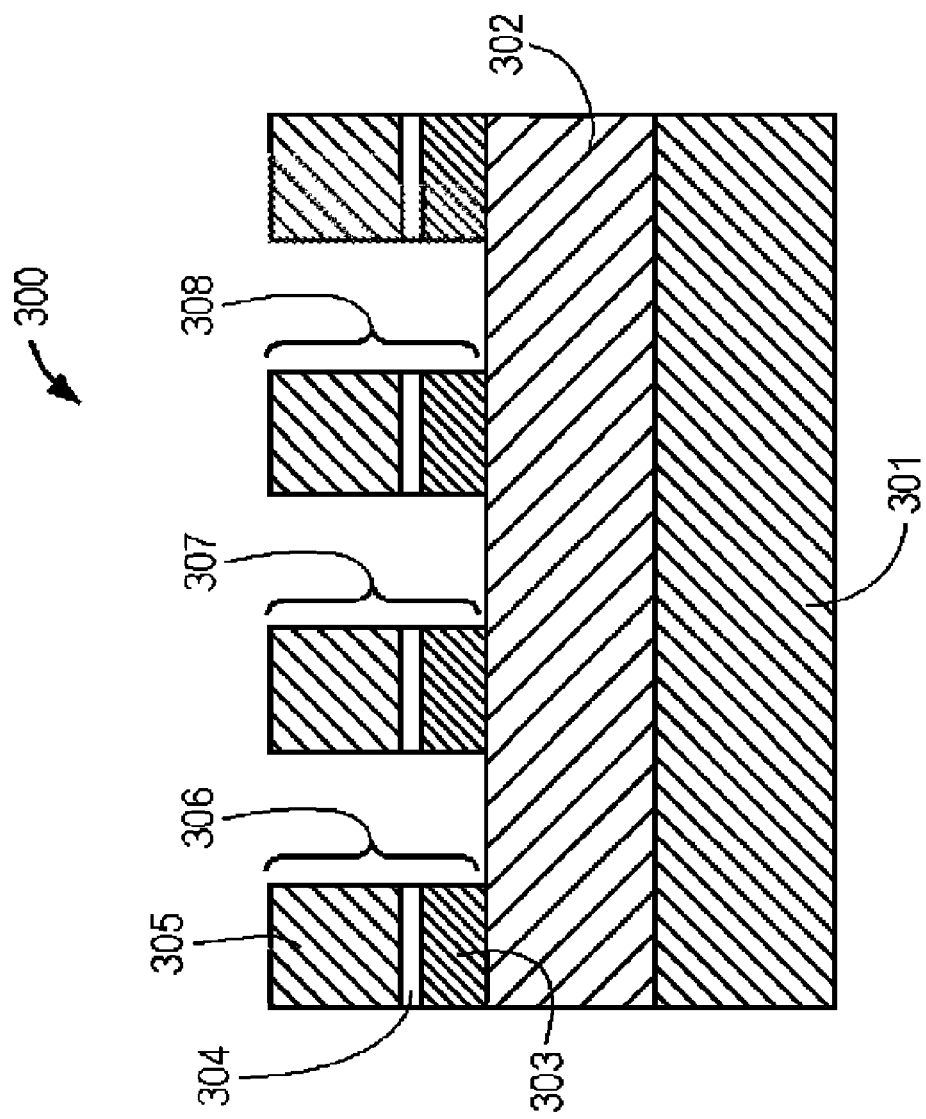
FIG. 3 is a simplified diagram illustrating a partially processed integrated circuit that includes gate structures.

At step 203, one or more gate structures are formed. As merely an example, a partially processed integrated circuit according to step 203 is illustrated in FIG. 3. FIG. 3 is a simplified diagram illustrating a partially processed integrated circuit that includes gate structures. This diagram is merely an example, which should not unduly limit the scope of the claims. One of ordinary skill in the art would recognize many variations, alternatives, and modifications.

As can be seen in FIG. 3, a partially processed integrated circuit 300 includes substrate 301, an etchable oxide layer 302, and gate structures 306, 307, and 308. It is to be understood that there could be other structures as parts of the partially processed integrated circuit 300 as well. Depending upon application, the gate structures can be in various forms. For example, the gate structure is in accordance with a design rule of 0.18 micron or less. According to a specific embodiment, the gate structures consists of poly material. According to another specific embodiment, the gate structures include oxide-nitride-oxide (ONO) material. For example, the ONO material is used as dielectric material. According to yet another specific embodiment, the stacked-gate structure is used to implement the gate structures. For example, the stacked-gate structure includes a floating poly gate, an inter poly dielectric layer, and a control poly gate. For example, various materials (e.g., aluminum oxide, hafnium oxide, tantalum oxide, hafnium silicon oxide, etc.) can be used to implement the inter poly dielectric layer. It is to be appreciated that the gate structure can be implemented with other forms of poly material as well.

Now referring back to FIG. 2. At step 204, photoresist material is provided. Depending upon application, various types of materials can be used as photoresist material. Typically, certain types of polymer material are used as photoresist material. For example, solid photoresist material essentially consisted of polymer material is place on desired structure and then melted.

Figure 4:
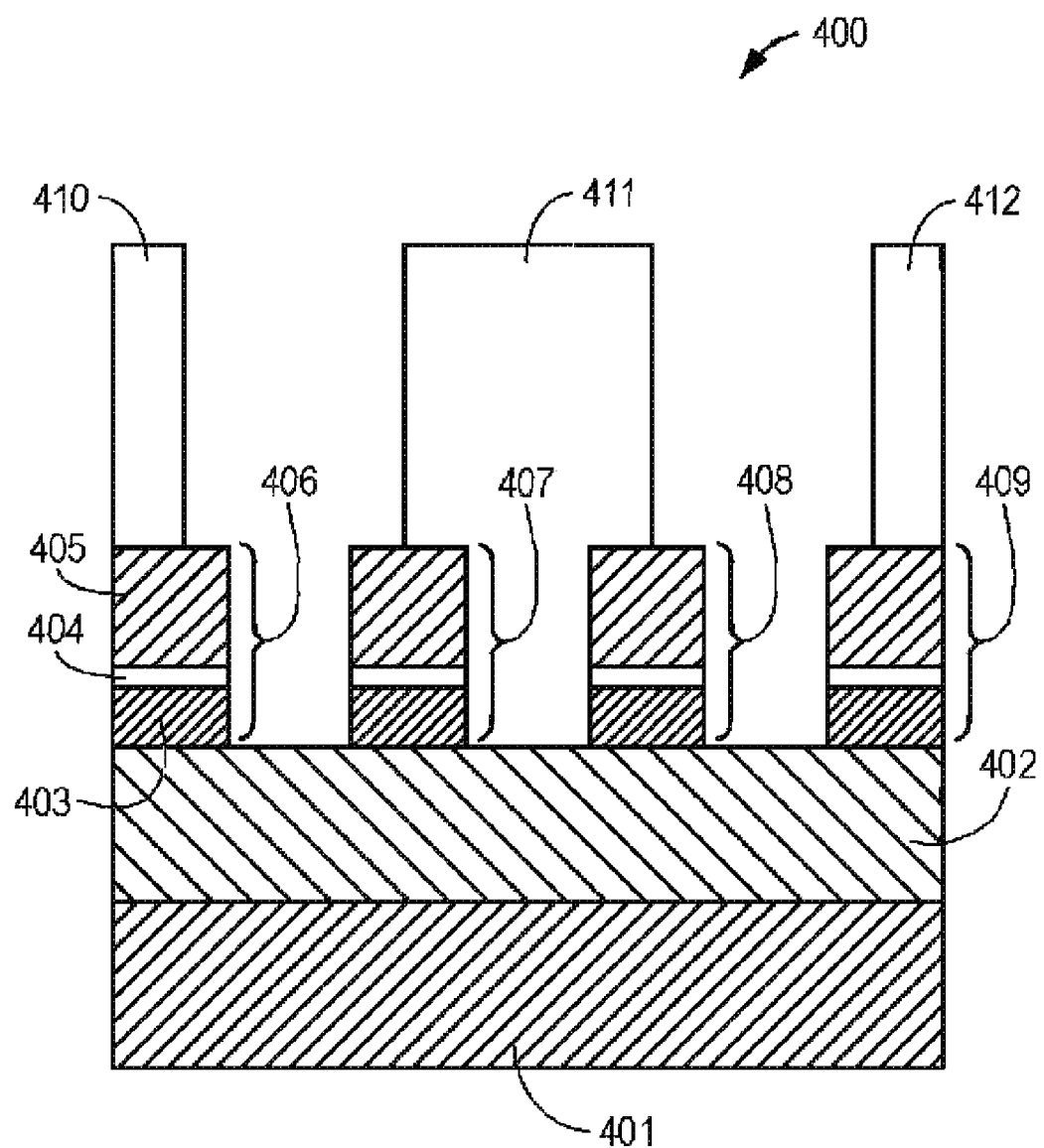
FIG. 4 is a simplified diagram illustrating a partially processed integrated circuit with photoresist materials deposited on gate structure according to an embodiment of the present invention.

FIG. 4 is a simplified diagram illustrating a partially processed integrated circuit with photoresist materials deposited on gate structure according to an embodiment of the present invention. This diagram is merely an example, which should not unduly limit the scope of the claims. One of ordinary skill in the art would recognize many variations, alternatives, and modifications.

As shown in FIG. 4, the partially processed integrated circuit 400 includes substrate 401, an etchable oxide layer 402, and gate structures 406, 407, and 408. It is to be understood that there could be other structures as parts of the partially processed integrated circuit 400 as well. Photoresists 410, 411, and 412 are based on the area where etching process is to be performed.

Now referring back to FIG. 2. At step 205, protective layers are formed on the sidewalls of the gate structures. According to an embodiment, protective layers are formed by anisotropic plasma drying etching process, where polymer materials are deposited on the sidewalls of the gate structures as polymer residues. For example, C-H type of polymer materials are used during the plasma drying etching process and deposited on the sidewalls of gate structures. As merely an example, a contact etch process is performed where polymers are provided at a high deposition rate. Depending upon application, protective layer on the sidewalls of the gate structure can be formed by various techniques.

Figure 5A:
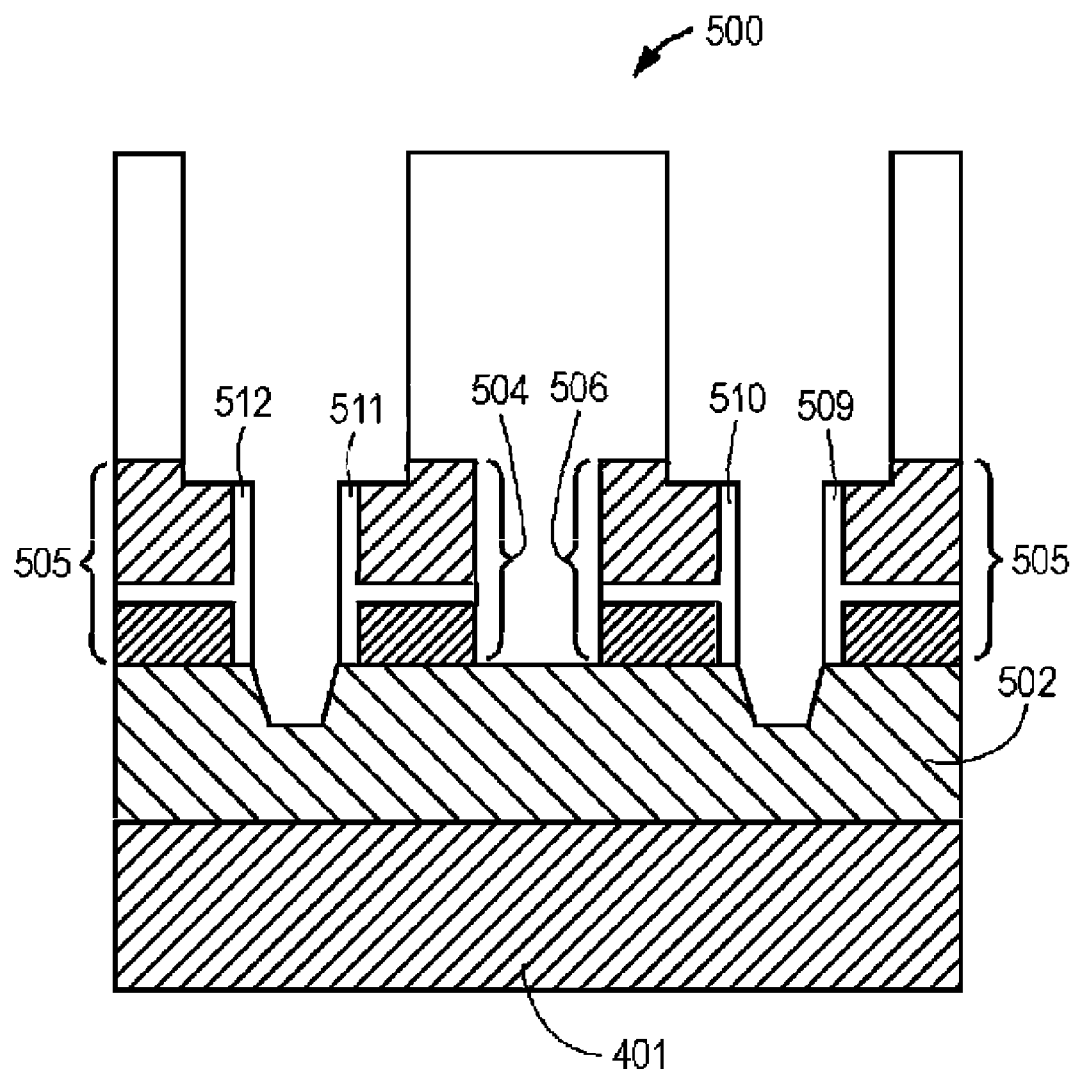
FIG. 5A is a simplified diagram illustrating partially processed integrated circuit where sidewalls of gate structures are covered by protective layers according to an embodiment of the present invention.

FIG. 5A is a simplified diagram illustrating partially processed integrated circuit where sidewalls of gate structures are covered by protective layers according to an embodiment of the present invention. This diagram is merely an example, which should not unduly limit the scope of the claims. One of ordinary skill in the art would recognize many variations, alternatives, and modifications.

As shown in FIG. 5A, the partially processed integrated circuit 500 includes substrate 501, an etchable oxide layer 502, and gate structures 503, 504, 505, 506, and 507. Protective layers 509, 510, 511, and 512 are formed on the sidewalls of the gate structures 503, 504, 505, 506, and 507. Depending upon application, protective layers can be formed by various types of material that have selectivity against the etchable oxide layer 502. For example, the protective layer consists of C-H type of polymer materials (e.g., polymer materials formed using plasma containing CH3F, CH2F2, CHF3, C4F8, C5F8, C4F6, etc.). Depending upon application, other type of materials can be used as protective layer. As can be seen from FIG. 5, the etchable oxide layer 502 is partially etched. For example, the etchable oxide layer 502 is partially etched by anisotropic dry etching process according as described in step 205 above. According to a specific embodiment, the amount of etching performed at step 205 is minimal, as the goal of the anisotropic etching process is to form protective layers on the sidewalls. According to another specific embodiment, the etching is performed at step 205 to form damascene structure. There can be other variations as well.

Figure 5B:
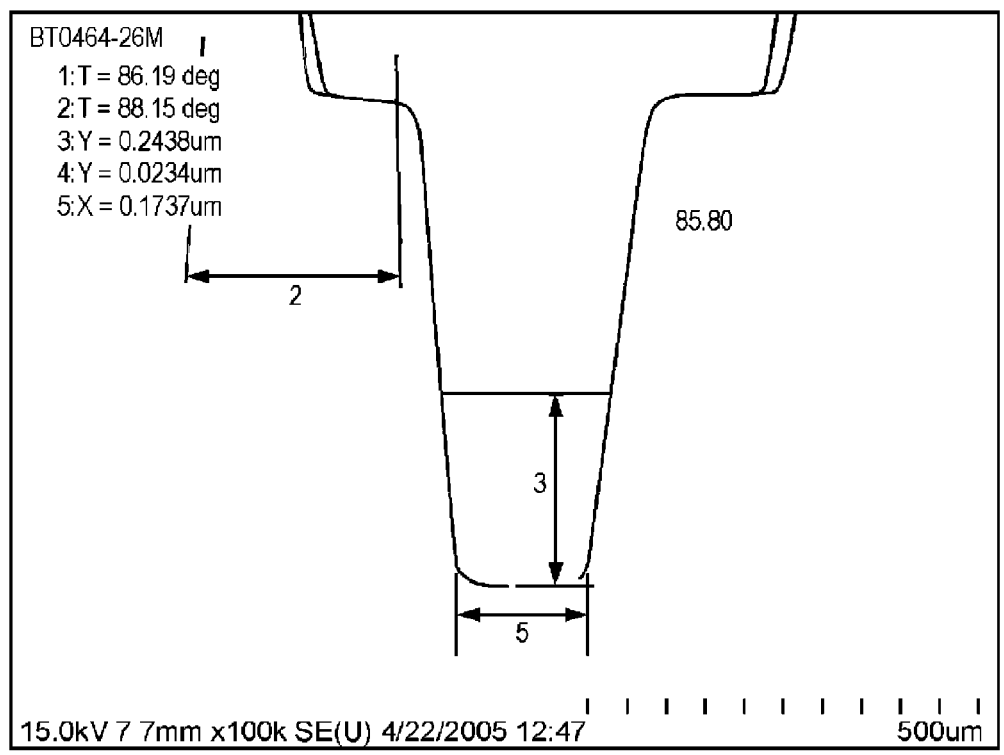
FIG. 5B is a simplified diagram illustrating protective layers formed on the sidewalls of gate structure according to an embodiment of the present invention.

FIG. 5B is a simplified diagram illustrating protective layers formed on the sidewalls of gate structure according to an embodiment of the present invention. This diagram is merely an example, which should not unduly limit the scope of the claims. One of ordinary skill in the art would recognize many variations, alternatives, and modifications. As an example, FIG. 5B illustrates protective layers formed on the sidewalls of poly gate structures after the substrate is subjected to drying etching with C-H type polymers.

Now referring back to FIG. 2. At step 206, etching is performed. According to a specific embodiment, SAS etching process using plasma species is performed. As explained above, since the sidewalls of gate structures (e.g., gate structures 511 and 512 in FIG. 5) protects the gate structures from being etched during the etching process, the gate structures provide alignment for the etching process and maintain well-defined profile after etching. In addition, since gate structures are protected, it is possible to perform etching for a relatively long period of time. For example, etching are performed with long process window without causing significant poly or silicon loss of gate structures.

Figure 6:
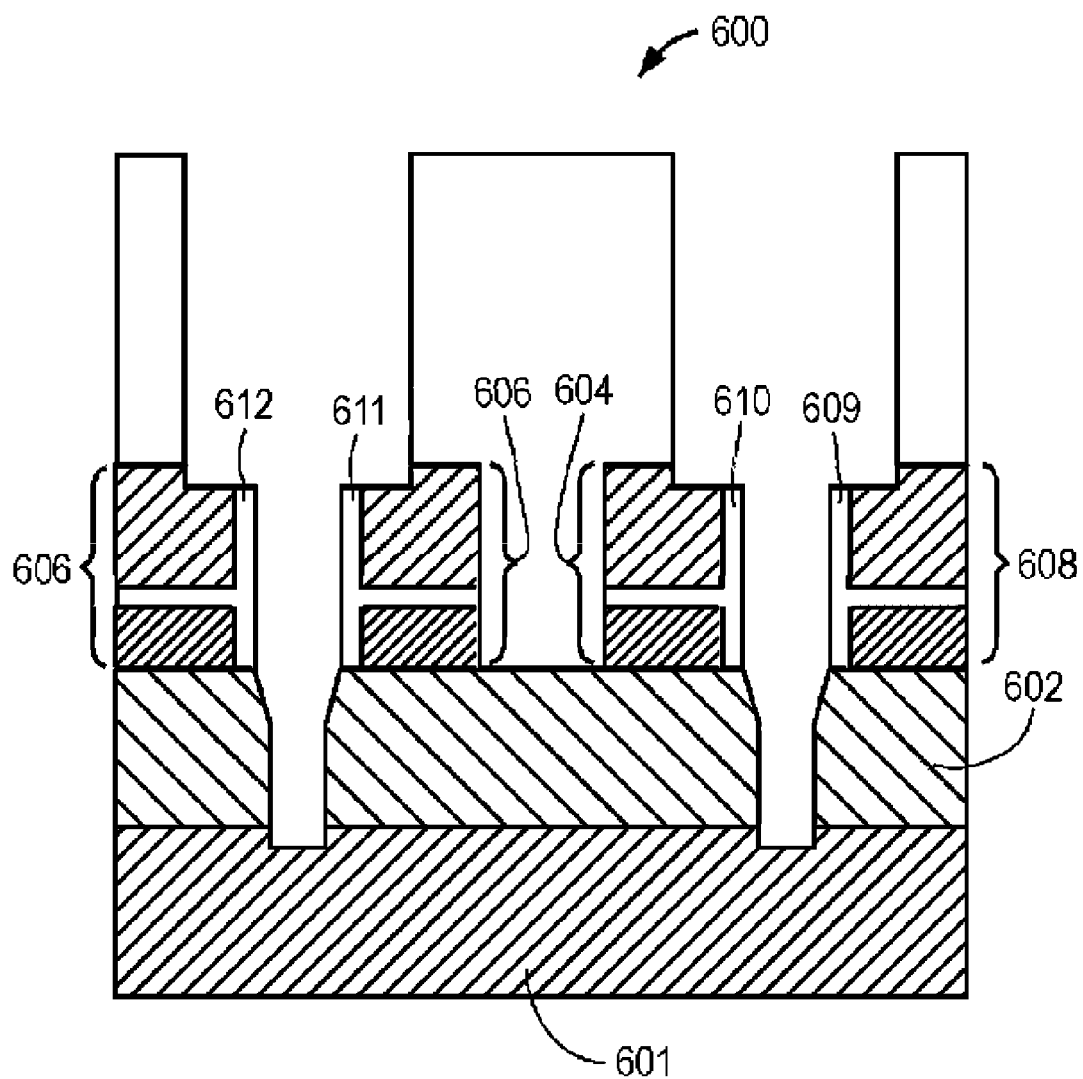
FIG. 6 is a simplified diagram illustrating partially processed integrated circuit where sidewalls of gate structures are covered by protective layers according to an embodiment of the present invention.

FIG. 6 is a simplified diagram illustrating partially processed integrated circuit where sidewalls of gate structures are covered by protective layers according to an embodiment of the present invention. This diagram is merely an example, which should not unduly limit the scope of the claims. One of ordinary skill in the art would recognize many variations, alternatives, and modifications.

As shown in FIG. 6, the partially processed integrated circuit 600 includes substrate 601, an etchable oxide layer 602, and gate structures 603, 604, 605, 606, and 607. Protective layers 609, 610, 611, and 612 are formed on the sidewalls of the gate structures 603, 604, 605, 606, and 607. For example, the etching process performed at step 206 etches at a much greater depth as compared to the etching performed at step 205. In a specific example, at step 206 the etchable oxide layer 602 is etched through and small portions of the substrate 601 is also etched away.

Now referring back to FIG. 2. At step 207, photoresists are removed. Depending upon applications, photoresists can be removed in various ways. According to a specific embodiment, photoresists are removed by at wet stripping process. According to another specific embodiment, photoresists are removed by chemical mechanical polishing (CMP) process. It is to be understood that there are other methods for removing photoresists as well.

At step 208, protective layers are removed. Depending upon applications, can be removed in various ways. According to a specific embodiment, the protective layers are removed by stripping. According to another specific embodiment, the protective layers are removed by ashing. There are other methods for removing protective layers, such as using plasma species, as well. According to an embodiment, step 207 and step 208 are performed in the same step. For example, photoresist and protective layers are consisted of essentially the same material and are removed using the same process.

Figure 7:
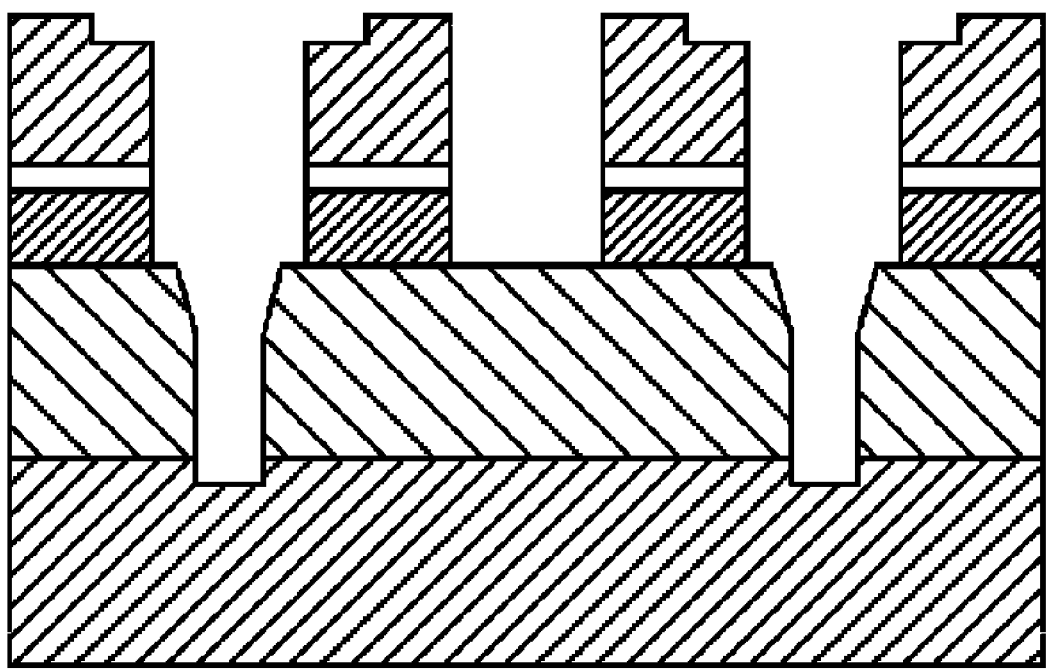
FIG. 7 is a simplified diagram illustrating partially processed integrated circuit after photoresists and protective layers on the sidewalls of gate structures are removed according to an embodiment of the present invention.

FIG. 7 is a simplified diagram illustrating partially processed integrated circuit after photoresists and protective layers on the sidewalls of gate structures are removed according to an embodiment of the present invention. This diagram is merely an example, which should not unduly limit the scope of the claims. One of ordinary skill in the art would recognize many variations, alternatives, and modifications. As an example, FIG. 7 shows that after the SAS etching process, while the etchable oxide material has been etched away, gate structures retain their definition.

Figure 7B:
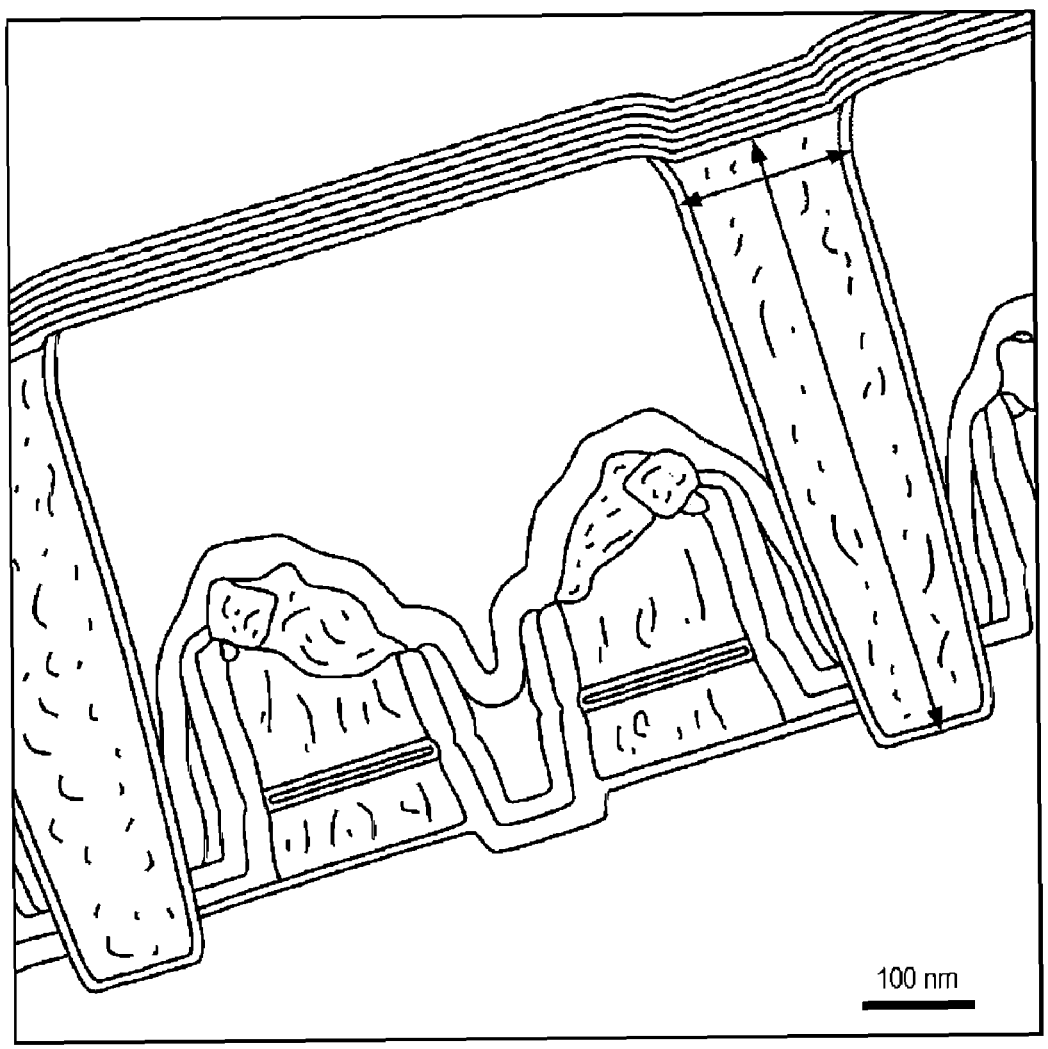
FIG. 7B is a simplified diagram illustrating a portion of a flash device manufactured according to an embodiment of the present invention.

To prove the effectiveness and usefulness of the present invention, FIG. 7B is provided. FIG. 7B is a simplified diagram illustrating a portion of a flash device manufactured according to an embodiment of the present invention. This diagram is merely an example, which should not unduly limit the scope of the claims. One of ordinary skill in the art would recognize many variations, alternatives, and modifications. As shown in FIG. 7B, the protective layers are formed on the sidewalls of gate structures before deep anisotropic etching is performed on the etchable material. As a result, well-defined corners and gate profiles are maintained after the etching process. As an example, cross section diagram in FIG. 7B is taken from 0.18 um flash array. It is to be understood that the present invention can be utilized in manufacturing other types of devices.

Figure 8A:
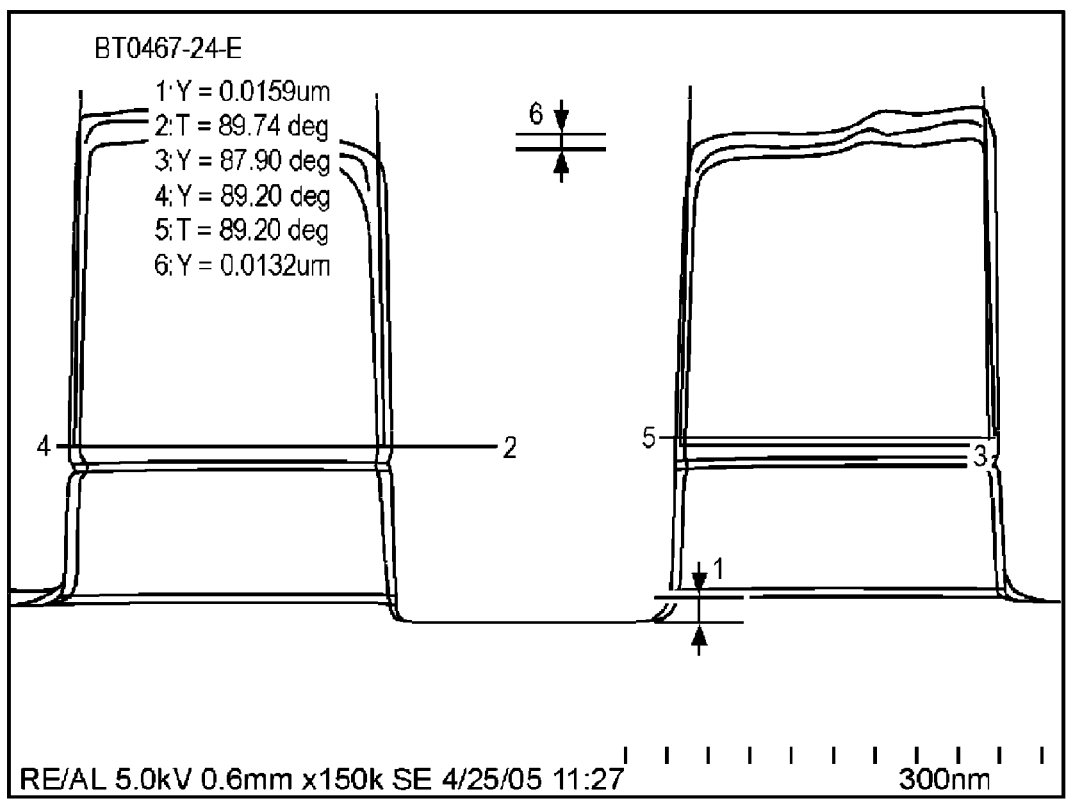
FIGS. 8A-8C are simplified diagrams illustrating profiles of partially processed integrated circuits according to an embodiment of the present invention.
Figure 8B:
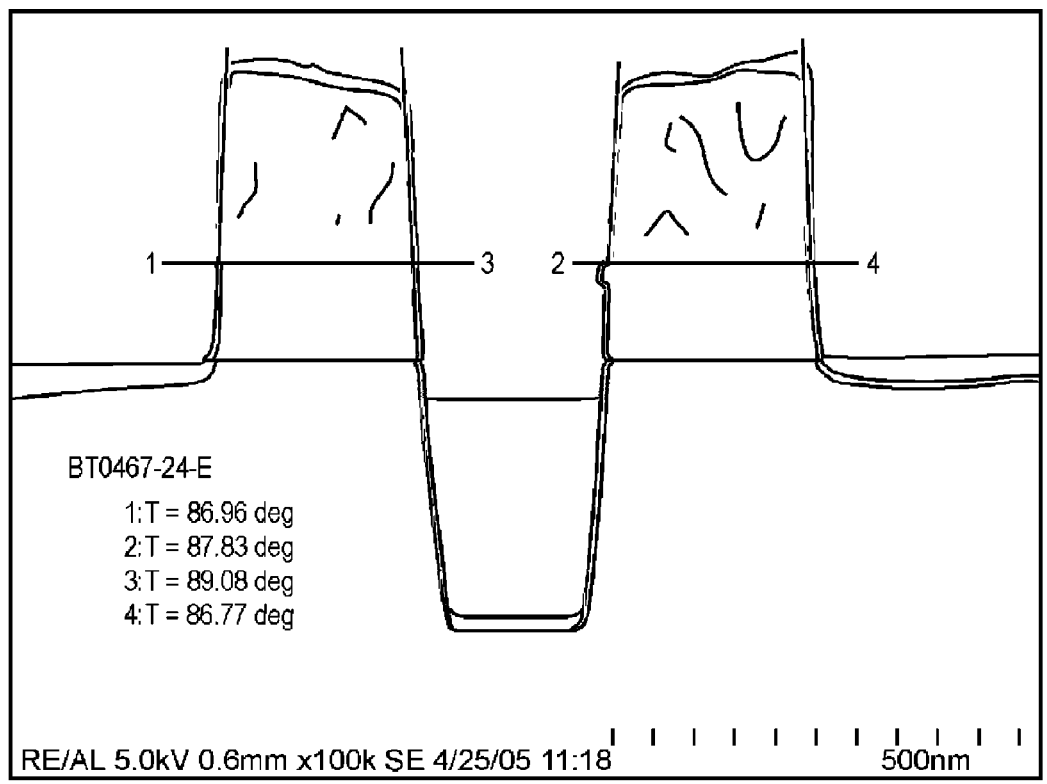
Figure 8C:
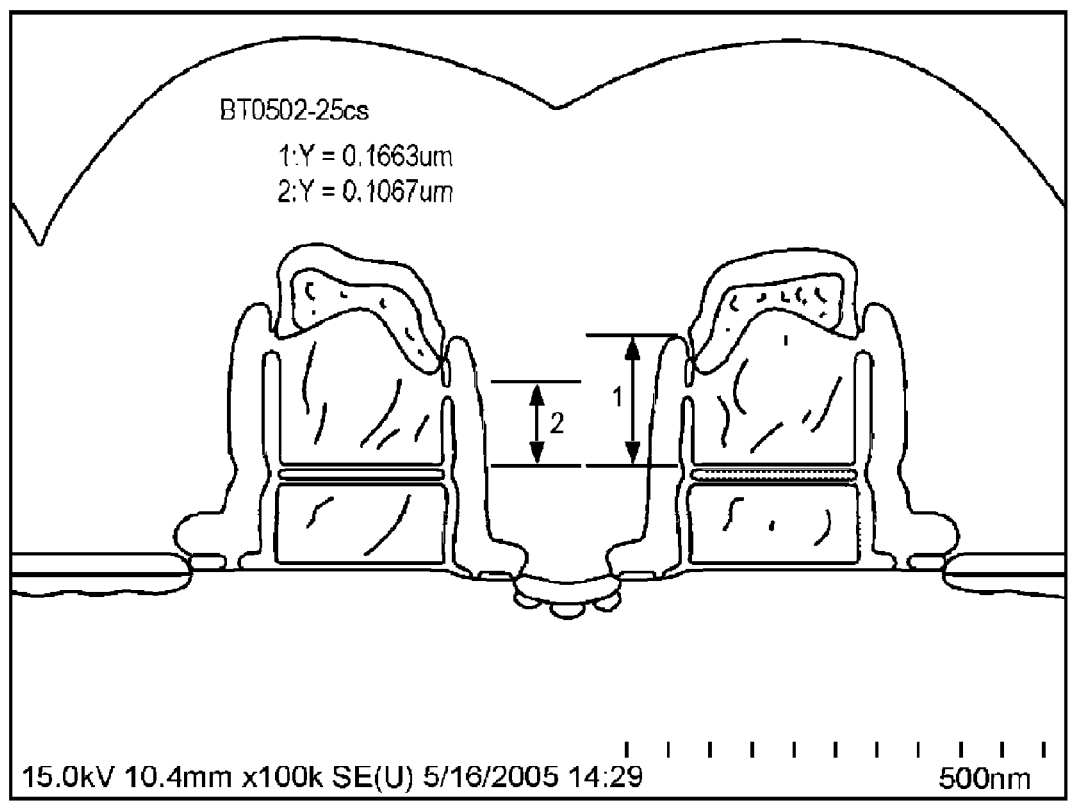

FIGS. 8A-8C are simplified diagrams illustrating profiles of partially processed integrated circuits according to an embodiment of the present invention. This diagram is merely an example, which should not unduly limit the scope of the claims. One of ordinary skill in the art would recognize many variations, alternatives, and modifications. As shown in each of the Figures, the profile shown little erosion at the sidewalls and corners and retain clean profiles.

According to an embodiment, the present invention provides a method for performing self-aligned source etching process. The method includes a step for providing a substrate material. The method also includes a step for forming a layer of etchable oxide material overlying at least a portion of the substrate material. The layer of etchable oxide material can be characterized by a first thickness. The layer of etchable oxide material includes a first portion, a second portion, and a third portion. The second portion is positioned between the first portion and the third portion. The method additionally includes a step for forming a plurality of structures (e.g., gate structures, etc.) overlying the layer of etchable oxide material. The plurality of structures includes a first structure and a second structure. The first structure includes a first sidewall and is positioned above the first portion. The second structure includes a second sidewall and is positioned above the third portion. The first sidewall faces the second sidewall. Additionally, the method includes a step for forming a plurality of photoresist layers overlying the plurality of structures, which includes a first photoresist layer overlying the first structure and a second photoresist layer overlying the second structure. Also, the method includes a step for performing a first dry etching process at a first depth, which causes forming a first polymer layer overlying the first sidewall and a second polymer layer overlying the second sidewall. In addition, the first dry etching process removes at least a second thickness of the second portion. The second thickness being less than the first thickness. For example, the purpose of the first dry etch process is to form protective layers on the sidewall structures and the material etched during this process is minimal. Moreover, the method includes a step for performing a second dry etching process at a second depth. The second depth is greater than the first depth. The second dry etching process moves at least a third thickness of the second portion. Additionally, the method includes a step for removing the plurality of photoresist layers. Further, the method includes a step for removing the first and second sidewalls. For example, the method is illustrated in FIG. 2.

According to another embodiment, the present invention provides a method for performing self-aligned source etching process. The method includes a step for providing a substrate material. The method also includes a step for forming a layer of etchable oxide material overlying at least a portion of the substrate material. The layer of etchable oxide material can be characterized by a first thickness. The layer of etchable oxide material includes a first portion, a second portion, and a third portion. The second portion is positioned between the first portion and the third portion. Further, the method includes a step for forming a plurality of gate structures overlying the layer of etchable oxide material. The plurality of gate structures includes a first gate structure and a second gate structure. The first gate structure includes a first sidewall and is positioned above the first portion. The second gate structure includes a second sidewall and is positioned above the third portion. The first sidewall faces the second sidewall. The method further includes a step for forming a plurality of photoresist layers overlying the plurality of gate structures. The plurality of photoresist layers includes a first photoresist layer overlying the first gate structure and a second photoresist layer overlying the second gate structure. The method includes a step for subjecting at least the plurality of gate structures to high rate polymer deposition, which causes forming a first polymer layer overlying the first sidewall and a second polymer layer overlying the second sidewall. Moreover, the method includes a step for performing a dry etching process at a first depth. The dry etching process removes at least a second thickness of the second portion. In addition the method includes a step for removing the plurality of photoresist layers. Also, the method includes a step for removing the first and second sidewalls. For example, the method is illustrated in FIG. 2.

According to yet another embodiment, the present invention provides a partially processed integrated circuit. For example, the partially process integrated circuit can be used in the process of manufacturing flash device. The partially processed integrated circuit includes a substrate material that is characterized by a substrate thickness and a substrate diameter. The partially processed integrated circuit also includes a layer of etchable oxide material overlying at least a portion of the substrate material. The layer of etchable oxide material includes a first portion, a second portion, and a third portion. The second portion is positioned between the first portion and the third portion, the first portion being characterized by a first thickness, the second portion being characterized by a second thickness. The third portion is characterized by a third thickness. The second thickness is slight less than the first thickness and the third thickness. The partially processed integrated circuit additionally includes a plurality of gate structures overlying the layer of etchable oxide material. The plurality of gate structures includes a first gate structure and a second gate structure. The first gate structure includes a first sidewall and is positioned above the first portion. The second gate structure includes a second sidewall and is positioned above the third portion. The first sidewall is facing the second sidewall. Moreover, the partially processed integrated circuit includes a plurality of photoresist layers overlying the plurality of gate structures. The plurality of photoresist layers includes a first photoresist layer overlying the first gate structure and a second photoresist layer overlying the second gate structure. Furthermore, the partially processed integrated circuit includes a plurality of polymer layers. The plurality of polymer layers includes a first polymer layer overlying the first sidewall and a second polymer layer overlying the second sidewall. For example, the method is illustrated in FIG. 5.

According to various embodiments, the present invention provides an improved technique for performing etching process and offers numerous advantages over conventional techniques. According to a specific embodiment, the present invention provides a two-step SAS etching process that utilizes protective layers on sidewalls of non-target structures. As a result, non-target structures maintain their definition after the etching process. It is also to be appreciated that the present invention provides longer process window for the etching process, and therefore better control, as compared to conventional techniques. There are other benefits as well.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A partially processed integrated circuit comprising:
   a substrate material being characterized by a substrate thickness and a substrate diameter;
   a layer of etchable oxide material overlying at least a portion of the substrate material, the layer of etchable oxide material including a first portion, a second portion, and a third portion, the second portion being positioned between the first portion and the third portion, the first portion being characterized by a first thickness, the second portion being characterized by a second thickness, the third portion being characterized by a third thickness, the second thickness being slightly less than the first thickness and the third thickness;
   a plurality of gate structures overlying the layer of etchable oxide material, the plurality of gate structures including a first gate structure and a second gate structure, the first gate structure including a first sidewall and being positioned above the first portion, the second gate structure including a second sidewall and being positioned above the third portion, the first sidewall facing the second sidewall;
   a plurality of photoresist layers overlying the plurality of gate structures, the plurality of photoresist layers including a first photoresist layer overlying the first gate structure and a second photoresist layer overlying the second gate structure; and
   a plurality of polymer layers, the plurality of polymer layers including a first polymer layer overlying the first sidewall and a second polymer layer overlying the second sidewall, wherein the polymer layers remain on the sidewalls after a portion of the etchable oxide material overlying the substrate is etched through and a portion of the substrate below is etched away.

2. The partially processed integrated circuit of claim 1 wherein the polymer layers comprises C-H type polymer material.

3. The partially processed integrated circuit of claim 2 wherein each of the plurality of gate structures comprises poly material.

4. The partially processed integrated circuit of claim 2 wherein the first gate structure comprises a stacked gate structure.

5. The partially processed integrated circuit of claim 2 wherein the first gate structure comprises a floating poly gate, an inter poly dielectric layer, and a control poly gate.

* * * * *